United States Patent
Sakamoto et al.

(10) Patent No.: US 8,064,159 B2
(45) Date of Patent: Nov. 22, 2011

(54) CURRENT PERPENDICULAR TO PLANE (CPP) MAGNETIC READ HEAD

(75) Inventors: Koji Sakamoto, Kanagawa-ken (JP); Koichi Nishioka, Kanagawa-ken (JP); Katsuya Mitsuoka, Kanagawa-ken (JP); Katsumi Hoshino, Kanagawa (JP); Yo Sato, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 19 days.

(21) Appl. No.: 12/642,269

(22) Filed: Dec. 18, 2009

(65) Prior Publication Data

US 2010/0157465 A1    Jun. 24, 2010

(30) Foreign Application Priority Data

Dec. 19, 2008  (JP) ................................ 2008-323473

(51) Int. Cl.
*G11B 5/127*    (2006.01)
(52) U.S. Cl. ...................................................... 360/110
(58) Field of Classification Search .................. None
See application file for complete search history.

(56) References Cited

U.S. PATENT DOCUMENTS

| | | | |
|---|---|---|---|
| 5,991,125 A * | 11/1999 | Iwasaki et al. | 360/324.12 |
| 6,995,961 B2 * | 2/2006 | Hasegawa et al. | 360/324.12 |
| 2003/0184925 A1 * | 10/2003 | Hasegawa et al. | 360/324.12 |
| 2005/0271904 A1 * | 12/2005 | Li et al. | 428/842.1 |
| 2007/0087227 A1 * | 4/2007 | Ma et al. | 428/833.1 |
| 2007/0291422 A1 | 12/2007 | Tsuchiya et al. | 360/324.11 |
| 2008/0226947 A1 | 9/2008 | Mizuno et al. | 428/811 |

FOREIGN PATENT DOCUMENTS

| | | |
|---|---|---|
| JP | 2005/019484 | 1/2005 |
| JP | 2008/227457 | 9/2008 |
| JP | 2008-277586 | 11/2008 |

* cited by examiner

*Primary Examiner* — Joseph Feild
*Assistant Examiner* — Huy Nguyen
(74) *Attorney, Agent, or Firm* — Zolka-Kotab, PC

(57) ABSTRACT

One general embodiment of the present invention is a magnetic read head including a magnetoresistive sensor where sense current flows in a stacking direction of the magnetoresistive sensor, i.e., perpendicular to the plane of the layers of the head. The magnetoresistive sensor comprises a free layer having a magnetization direction that is affected by external magnetic fields and includes a Heusler alloy layer and a Co-based amorphous metal layer, a fixed layer which is stacked with the free layer and has a fixed magnetization direction, and a non-magnetic intermediate layer between the free layer and the fixed layer.

16 Claims, 7 Drawing Sheets

Co-X : Ta, Ti, Zr, Nb, Hf, W, B
Co-Fe-X : Ta, Ti, Zr, Nb, Hf, W, B

CURRENT PERPENDICULAR TO PLANE (CPP) MAGNETIC READ HEAD

RELATED APPLICATIONS

The present application claims priority to a Japanese Patent Application filed Dec. 19, 2008, under Appl. No. 2008-323473, which is incorporated herein by reference.

FIELD OF THE INVENTION

The present invention relates to the structure of a current perpendicular to plane (CPP) magnetic read head, in particular, to the structure of a free layer in a CPP magnetic read head.

BACKGROUND OF THE INVENTION

A hard disk drive (HDD) is typically equipped with a magnetic recording medium and a magnetic head, and the magnetic head reads and writes data on the magnetic recording medium. The magnetic head in the HDD typically includes a write head for writing information on the magnetic recording medium (magnetic disk) as magnetic signals and a read head for reading out signals recorded on the magnetic recording medium as magnetic signals. The read head typically includes a magnetoresistive effect laminated body having a plurality of magnetic thin films and non-magnetic thin films and it is called a magnetoresistive effect head because it reads signals by utilizing the magnetoresistive effect.

There are several kinds of laminated structures for magnetoresistive effect heads and they are classified into categories such as an AN MR head, a GMR head, a CPP-GMR head, and a TMR head in accordance with the principle of the magnetic resistance used therein. They use magnetoresistive effect (AN MR), giant magnetoresistive effect (GMR), current perpendicular to plane GMR effect (CPP-GMR effect), tunnel magetoresistive effect (TMR), respectively, and transduce input magnetic fields entering the read head from the magnetic recording medium into voltage variations.

Nowadays, development in high recording density has created a requirement for a reading scheme with higher sensitivity. In a range of 500 (Gb/in.$^2$) to 2 (Tb/in.$^2$), the TMR which has a very high MR ratio is advantageous in view of an improvement of sensitivity. For ultra high recording density exceeding 2 (Tb/in.$^2$), the CPP-GMR or the like is expected to be the main type used. Being different from the current in plane GMR (CIP-GMR) in which the sense current flows parallel to the film planes of the magnetoresistive effect stacked body, the TMR and the CPP-GMR are schemes in which the sense current flows perpendicular to the film planes, i.e., in the direction of stacking of the film planes. In the present specification, the scheme like this is referred to as a CPP scheme; and a read head using a CPP scheme is referred to as a CPP read head.

The magnetoresistive effect laminated body typically includes a fixed layer whose magnetization direction is fixed and a free layer whose magnetization direction changes with external magnetic fields. The magnetoresistance change and output increase with the spin polarizability of the free layer. One type of half-metals with a 100% or almost 100% spin polarizability is Heusler alloy. It is proposed to use a Heusler alloy in a free layer in Japanese Unexamined Patent Application Publication No. 2008-227457.

If a Heusler alloy is used in a free layer, however, the magnetostriction is so large that the element easily becomes unstable. Thus, Japanese Unexamined Patent Application Publication No. 2008-227457 proposes a free layer structure with a Heusler alloy layer, a soft magnetic layer and a magnetostriction reduction layer between them. The magnetostriction reduction layer consists of elements of the fourth group, the fifth group or the sixth group. It indicates that the free layer structure achieves a high MR ratio and low magnetostriction.

Japanese Unexamined Patent Application Publication No. 2008-227457 discloses a magnetostriction reduction layer made of a Hf film, a Ti film, a Zr film, a Ta film or a W film. If an intermediate layer is formed between a Heusler alloy layer and a soft magnetic layer, however, it is important to consider the magnetic coupling between the Heusler alloy layer and the soft magnetic layer.

If the intermediate layer between the Heusler alloy layer and the soft magnetic layer is made of a non-magnetic material like the material disclosed in Japanese Unexamined Patent Application Publication No. 2008-227457, the magnetic coupling of the Heusler alloy layer and the soft magnetic layer is severed, so they do not work integrally but work independently. Thus, the magnetic volume of each of the layers is reduced compared to the layers working integrally, resulting in the increase of magnetic fluctuations caused by thermal excitation. The fluctuations increase noise in read operations of the read head and error rates. Thus, it is preferable that the intermediate layer has a property such that the Heusler alloy layer and the soft magnetic layer work integrally. Namely, non-magnetic materials are not preferred for the intermediate layer and it is preferably made of a magnetic material.

Accordingly, a technique is desired to accomplish a high MR ratio and low magnetostriction in a CPP magnetic read head with a free layer including a Heusler alloy layer and provide a CPP read head having a superior noise property as well.

SUMMARY OF THE INVENTION

One general embodiment of the present invention is a magnetic read head including a magnetoresistive sensor where sense current flows in a stacking direction of the magnetoresistive sensor, i.e., perpendicular to the plane of the layers of the head. The magnetoresistive sensor comprises a free layer having a magnetization direction that is affected by external magnetic fields and includes a Heusler alloy layer and a Co-based amorphous metal layer, a fixed layer which is stacked with the free layer and has a fixed magnetization direction, and a non-magnetic intermediate layer between the free layer and the fixed layer.

Any of these embodiments may be implemented in a magnetic data storage system such as a disk drive system, which may include a magnetic head, a slider for supporting the head, a drive mechanism for passing a magnetic medium (e.g., hard disk) over the magnetic head, and a control unit electrically coupled to the magnetic head for controlling operation of the head.

Other aspects and advantages of the present invention will become apparent from the following detailed description, which, when taken in conjunction with the drawings, illustrate by way of example the principles of the invention.

DETAILED DESCRIPTION

Figure 1:
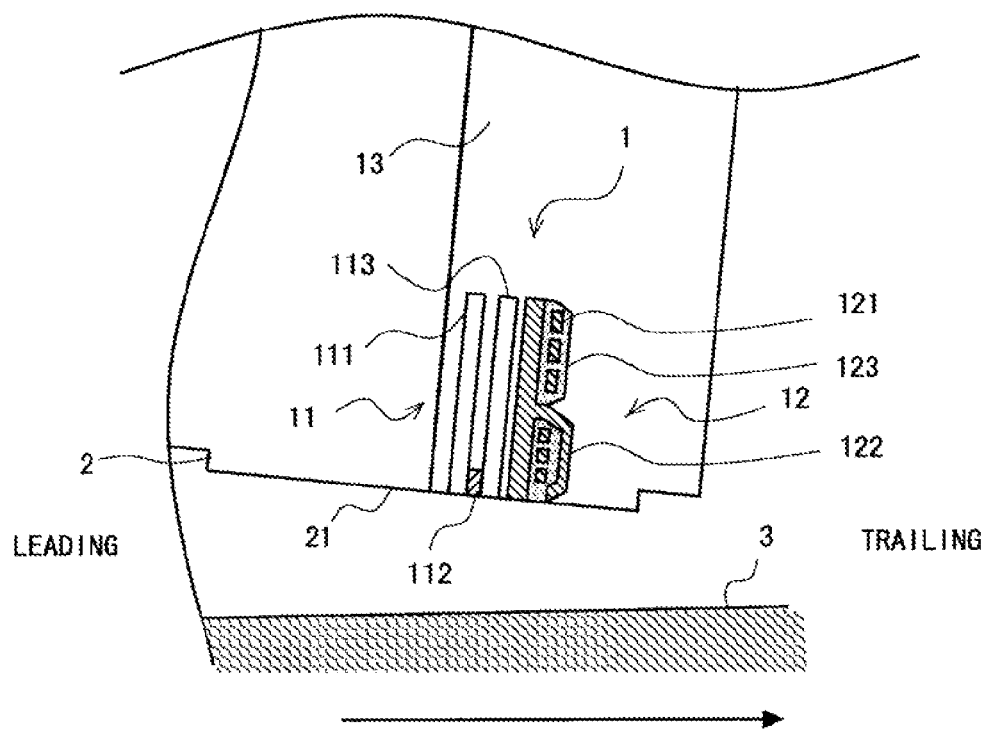
FIG. 1 is a cross-sectional view schematically showing the structure of a magnetic head according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

it must also be noted that, as used in the specification and the appended claims, the singular forms "a," "an" and "the" include plural referents unless otherwise specified.

One general embodiment of the present invention is a magnetic read head including a magnetoresistive sensor where sense current flows in a stacking direction of the magnetoresistive sensor, i.e., perpendicular to the plane of the layers of the head. The magnetoresistive sensor comprises a free layer having a magnetization direction that is affected by external magnetic fields and includes a Heusler alloy layer and a Co-based amorphous metal layer, a fixed layer which is stacked with the free layer and has a fixed magnetization direction, and a non-magnetic intermediate layer between the free layer and the fixed layer.

In a preferred configuration, the Co-based amorphous metal layer includes at least one element selected from the following group: Ta, Ti, Zr, Nb, Hf, W and B. In a preferred configuration, the free layer further includes a metal crystal soft magnetic layer, and the Co-based amorphous metal layer is provided between the soft magnetic layer and the Heusler alloy layer. Further, the Co-based amorphous metal layer is preferably made of Co—Fe—X, where X is one or more elements of Ta, Ti, Zr, Nb, Hf, W and B. Further, the Co-based amorphous metal layer may be one or more orders of magnitude thinner than the Heusler alloy layer. Alternatively, the order of magnitude of the thickness of the Co-based amorphous metal layer is no less than the order of magnitude of thickness of the Heusler alloy layer.

In a preferred configuration, the Co-based amorphous metal layer is made of Co—X, where X is one or more elements selected from Ta, Ti, Zr, Nb, Hf, W and B. In a preferred configuration, the fixed layer includes a Heusler alloy layer. In a preferred configuration, the free layer further includes a nanomagnetic layer having a BCC structure, where the non-magnetic intermediate layer, the nanomagnetic layer and the Heusler alloy layer are formed successively in this order, and the nanomagnetic layer is one or more orders of magnitude thinner than the Heusler alloy layer. In one approach, the nanomagnetic layer is made of a Co—Fe alloy and the Fe proportion is 30 at % or more.

Accordingly, the present invention, according to several embodiments thereof, p[provides a CPP read head with a high MR ratio and low magnetostriction.

Hereinafter, a preferred embodiment of the present invention is described referring to the drawings. Throughout the drawings, the like components are denoted by like reference numerals, and their repetitive description is omitted if not necessary for the sake of clearness in the explanation. In the preferred embodiment described hereinbelow, the present invention is applied to a read head for a hard disk drive (HDD). The read head according to the present embodiment is a current perpendicular to plane (CPP) head in which sense current flows in the laminating direction of the magnetoresistive sensor film (perpendicular to the plane).

A CPP magnetic head according to one embodiment has a feature in a free layer structure in a magnetoresistive sensor film. A free layer according to the present embodiment includes stacked layers and has a Heusler alloy layer and a Co-based amorphous metal layer. The free layer structure accomplishes a high MR ratio and low magnetostriction and provides a CPP head with a superior noise property.

Before describing a feature of the CPP read head according to the present embodiment, the entire configuration of the magnetic head will be outlined. FIG. 1 is a cross-sectional view schematically showing the structure of the magnetic head 1. The magnetic head 1 reads and writes data from and to a magnetic disk 3. The magnetic head 1 is equipped with a read head 11 and a write head 12 arranged in order from its traveling direction side (leading side). The magnetic head 1 is formed on the trailing side (the other side of the leading side) of a slider 2. The read head 11 includes a lower shield 111, a magnetoresistive sensor 112, and an upper shield 113 in order from the leading side.

The write head 12 includes a thin film coil 121 and write magnetic poles 122. The thin film coil 121 is enclosed with an insulator 123. The write head 12 is an inductive element for generating magnetic fields between the write magnetic poles 122 from electric current running through the thin film coil 121 and for writing magnetic data onto the magnetic disk 3. The read head 11 is a magnetoresistive element and includes a magnetoresistive sensor 112 having magnetic anisotropy and reads out magnetic data recorded on the magnetic disk 3 by use of the resistance changing in accordance with magnetic fields from the magnetic disk 3. The read head according to one embodiment is a CPP read head and the lower shield 111 and the upper shield 113 are used as electrodes for supplying the magnetoresistive sensor 112 with detection current.

The magnetic head 1 is formed on an AlTic substrate constituting the slider 2 by using a thin film forming process. The magnetic head 1 and the slider 2 constitute a head slider. The head slider flies over the magnetic disk 3 and the surface 21 facing the magnetic disk is called an air bearing surface (ABS). The magnetic head 1 is equipped with a protective film 13 made of alumina, for example, around the write head 12 and the read head 11, and the entire magnetic head 1 is protected by the protective film 13.

Figure 2:
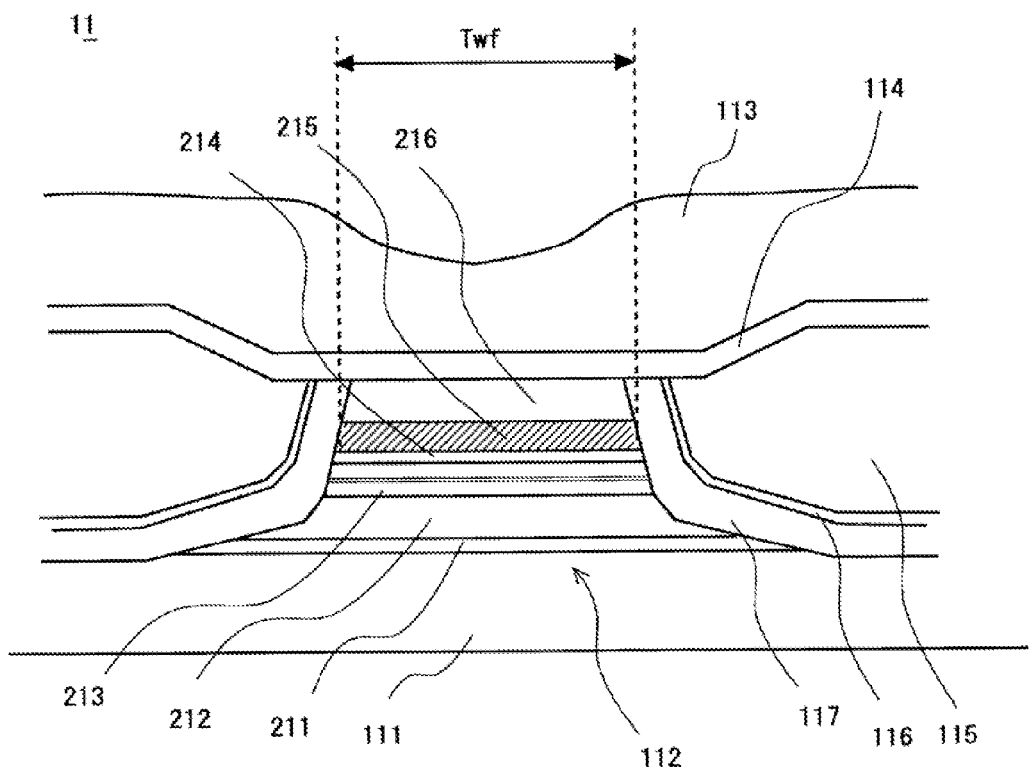
FIG. 2 is a cross-sectional view schematically illustrating the structure of a CPP read head according to one embodiment.

FIG. 2 is a cross-sectional view schematically illustrating the structure and configuration of the CPP read head 11 in which the magnetoresistive sensor structures described herein may be employed. FIG. 2 schematically depicts its cross-sectional structure as viewed from the ABS 21 of the head slider. The bottom of FIG. 2 is the leading side and the top is the trailing side. In the present specification, the AlTic substrate side on which the read head 11 is formed, i.e., the slider 2 side, is defined as the bottom and the opposite trailing side is defined as the top. The each layer of the read head 11 may be formed sequentially from the bottom. The read head II of the present embodiment is a current perpendicular to plane magnetoresistance (CPP-MR) head and sense current flows in the layer stack direction (vertical to the film plane and up-down direction in FIG. 2).

The magnetoresistive sensor 112 is a multi-layer film having a plurality of layers. The magnetoresistive sensor 112 is provided between the lower shield 111 and the upper shield 113. The lower shield 111 and the upper shield 113 function as magnetic shields, and a lower electrode and an upper electrode respectively for supplying sense current to the magnetoresistive sensor 112. Under the upper shield 113, an upper magnetic separation film 114 made of an electrical conductor is formed.

The magnetoresistive sensor 112 comprises a sensor underlayer 211, an antiferromagnetic film 212, a fixed layer 213, a non-magnetic intermediate layer 214, a free layer 215, and a sensor cap film 216 sequentially stacked from the lower layer. Each layer preferably physically contacts the adjacent layers. The sensor underlayer 211 is made of non-magnetic material such as Ta and a NiFeCo alloy, and may be a single layer structure as shown in the drawing or a laminated structure.

Exchange interaction with the anti-ferromagnetic film 212 works on the fixed layer 213 so that the magnetization direction is fixed. The track width of the free layer 215 is denoted by Twf. The magnetoresistive effect head, in use, utilizes the resistance changes caused by changes in the magnetization direction of the free layer 215 relative to the magnetization direction of the fixed layer 212. Namely, if the magnetization direction of the free layer 215 relative to the magnetization direction of the fixed layer 213 changes due to magnetic fields from the magnetic disk, the resistance (current value) of the magnetoresistive sensor 112 changes. Thereby, the read head 11 or system can detect narrowed external information magnetic fields by detecting the resistance (current value) of the magnetoresistive sensor 112.

In order to suppress Barkhausen noise caused by non-uniform magnetic domains of the free layer 215, hard bias films 115 which are magnetic domain control films may be provided at the right and left sides of the magnetoresistive sensor 112. Typically, the hard bias films 115 are made of a Co alloy and made of a CoCrPt alloy or a CoPt alloy, for example. Bias magnetic fields from the hard bias films 115 act on the free layer 215 to have a single magnetic domain and stabilize the magnetic action of the free layer.

The hard bias films 115 are formed on the hard bias underlayer films 116. As lower layers of the hard bias underlayer films 116, junction insulating films 117 are formed. The junction insulating films 117 are provided between the hard bias underlayer films 116 and a lower shield film 111 and the magnetoresistive sensor 112 and they cause sense current not to flow outside of the magnetoresistive sensor 712. The junction insulating films 117 may be made of $Al_2O_3$, for example, or any other insulating material. The magnetoresistive sensors described herein may be applied to a read head having a different hard bias film structure.

Figure 3:
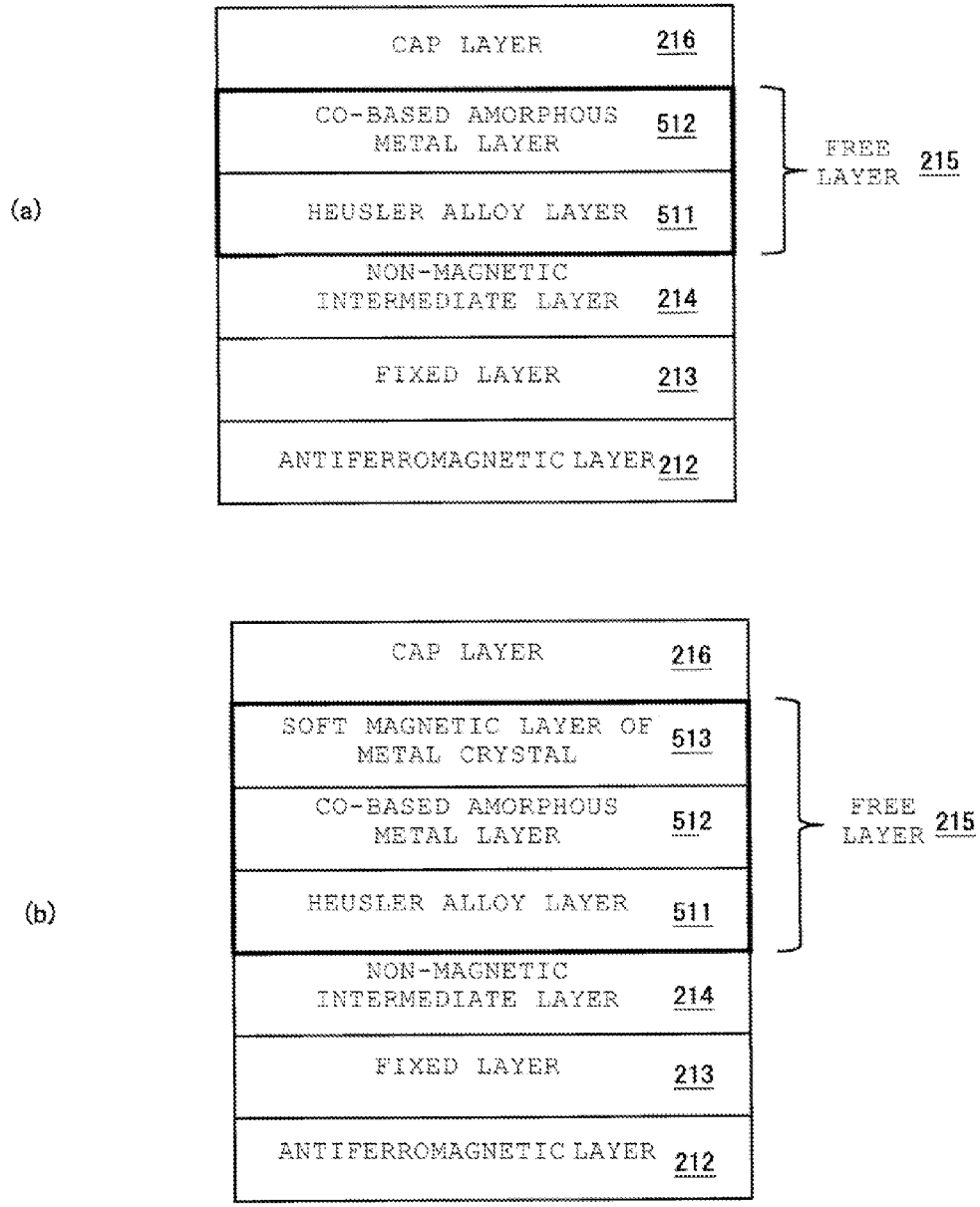
FIGS. 3(a) and 3(b) schematically illustrate the laminated structure of a magnetoresistive sensor according to one embodiment.

FIGS. 3(a) and 3(b) schematically illustrate the laminated structure of magnetoresistive sensor s112 according to two embodiments. As described referring to FIG. 2, the magnetoresistive sensor 112 has the antiferromagnetic layer 212, the fixed layer 213, the non-magnetic intermediate layer 214, the free layer 215 and the cap layer 216 sequentially stacked from the lower layer. The stacking order of the layers except for the cap layer 216 may be reversed. Namely, the free layer, the non-magnetic intermediate layer, the fixed layer and the antiferromagnetic film may be sequentially stacked from the lower layer.

The antiferromagnetic layer 212 is made of a antiferromagnetic material such as PtMn and MnIr. The fixed layer 213 is typically a laminated fixed layer and includes two ferromagnetic layers and a non-magnetic layer between them. For example, the ferromagnetic layers are made of a CoFe alloy and the non-magnetic layer is made of Ru. The two ferromagnetic layers are coupled by exchange interaction and the fixed magnetization is stabilized. The exchange interaction with the antiferromagnetic film 212 is acted on the lower ferromagnetic layer and the magnetization direction is fixed. The fixed layer 213 may have a single layer structure. The non-magnetic intermediate layer 214 is typically made of non-magnetic conductor, for example, made of Cu. The sensor cap film 216 is made of a non-magnetic conductive material, Ta for example.

A feature of the magnetoresistive sensor 112 disclosed herein is that the free layer 215 has a Heusler alloy layer 511 and a Co-based amorphous metal layer 512. In the structure in FIG. 3(a), the free layer 215 includes the Heusler alloy layer 511 and the Co-based amorphous metal layer 512. In the structure in FIG. 3(b), the free layer 215 includes the Heusler alloy layer 511, a soft magnetic layer of metal crystal 513 and the Co-based amorphous metal layer 512 between them. The free layer 215 including the Heusler alloy layer 511 and the Co-based amorphous metal layer 512 accomplishes a CPP read head with a high MR ratio and low magnetostriction.

In the structures in FIG. 3(a) and FIG. 3(b), the free layer 215 may have a metal layer other than the depicted layers. The free layer 215 may have a plurality of Heusler alloy layers, a plurality of metal crystal soft magnetic layers or a plurality of Co-based amorphous metal layers.

In the structure in FIG. 3(a), the Co-based amorphous metal layer 512 and the Heusler alloy layer 511 are in contact with each other and form an interface. It results in the large magnetic coupling between the Co-based amorphous metal layer 512 and the Heusler alloy layer 511. Alternatively, if the two layers are strongly magnetically coupled, an intermediate layer may be provided between the two layers. Specifically, a metal crystal soft magnetic layer or an antiferromagnetic coupling layer may be disposed between the Co-based amorphous metal layer 512 and the Heusler alloy layer 511. As the metal crystal soft magnetic layer, a layer made of ferromagnetic elements Co, Fe or Ni, or an alloy thereof may be used. As the antiferromagnetic coupling layer, a layer made of Cu or Ru may be used.

In the structure in FIG. 3(b), the Co-based amorphous metal layer 512 and the Heusler alloy layer 511 are in contact with each other and form an interface. The Co-based amorphous metal layer 512 and the metal crystal soft magnetic layer 513 are in contact with each other and form an interface. It results in the great magnetic coupling between the Heusler alloy layer 511 and the metal crystal soft magnetic layer 513. Alternatively, if the Heusler alloy layer 511 and the metal crystal soft magnetic layer 513 are magnetically coupled strongly, an intermediate layer may be provided between the Co-based amorphous metal layer 512 and each of the two layers. As an intermediate layer, a metal crystal soft magnetic layer or an antiferromagnetic coupling layer may be formed, as described referring to FIG. 3(a).

In the structure in FIG. 3(a), preferably, the order of magnitude of the thickness of the Co-based amorphous metal layer 512 is no less than the order of magnitude of the thickness of the Heusler alloy layer 511. In practical design, they are preferably the same order of magnitude. For example, if the thickness of the Heusler alloy layer 511 is the order of 10 Å, the thickness of the Co-based amorphous metal layer 512 is also the order of 10 Å. In this structure, the Co-based amorphous metal layer 512 contributes actively to the MR output with the Heusler alloy layer 511.

In contrast, in the free layer structure in FIG. 3(b), the Co-based amorphous metal layer 512 aims to function as an intermediate layer between the Heusler alloy layer 511 and the metal crystal soft magnetic layer 513. Thus, preferably, the Co-based amorphous metal layer 51 is one or more orders of magnitude thinner than the Heusler alloy layer 511 and the metal crystal soft magnetic layer 513. For example, if the Heusler alloy layer 511 and the metal crystal soft magnetic layer 513 have a thickness of several tens of angstroms, the Co-based amorphous metal layer 512 may have a thickness of several angstroms or less. This description about thickness can be applied to the metal crystal soft magnetic layer and antiferromagnetic layer used as an intermediate layer between the Co-based amorphous metal layer 512 and another layer.

In the structures shown in FIGS. 3(a) and 3(b), the Heusler alloy layer 511 is formed at the non-magnetic intermediate layer 214 side and the Heusler alloy layer 511 is formed between the Co-based amorphous metal layer 512 and the non-magnetic intermediate layer 214. In order to increase the MR output by the Heusler alloy layer 511, it is preferable that the Heusler alloy layer 511 be located closer to the non-magnetic intermediate layer 214 than the Co-based amorphous metal layer 512. In order to obtain a high MR output by the Heusler alloy layer 511, it is preferable to form a nanomagnetic layer which has a BCC structure and a thickness less than the Heusler alloy layer 511 by one or more orders of magnitude before forming the Heusler alloy layer. Namely, it is preferable to form the Heusler alloy layer after the nanomagnetic layer. Preferably, the nanomagnetic layer is a Co—Fe alloy layer with Fe of 30 at % or more having a BCC structure for a higher MR ratio.

Figure 4:
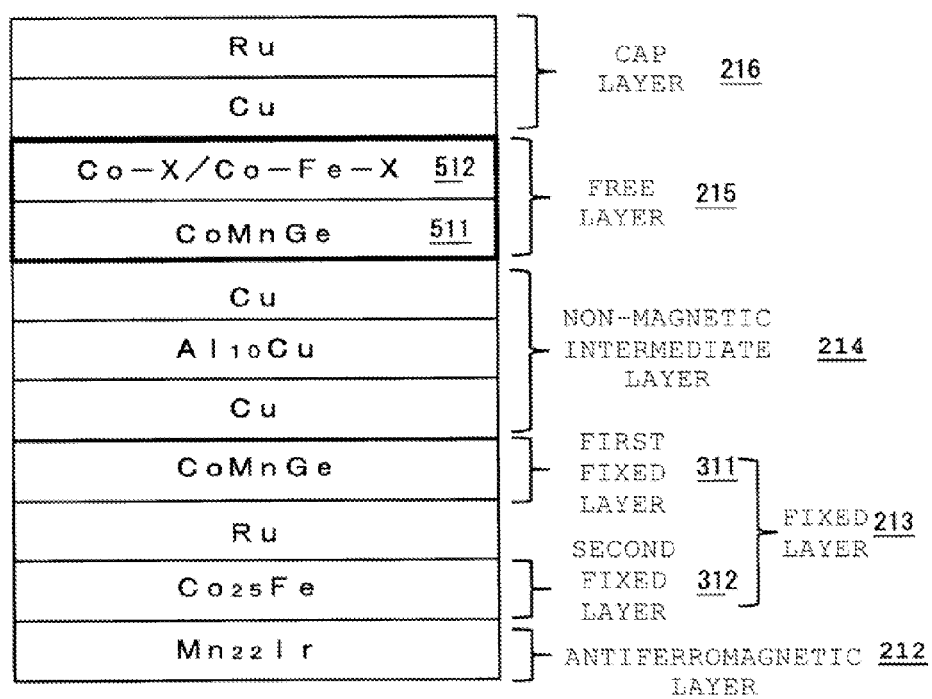
FIG. 4 schematically illustrates a preferred example of a magnetoresistive sensor with the laminated structure depicted in FIG. 3(a).

FIG. 4 depicts a preferred example of the magnetoresist sensor 112 with the laminated structure in FIG. 3(a). The antiferromagnetic layer 212 is made of $Mn_{22}Ir$. The fixed layer 213 has a first fixed layer 311 of the upper layer and a second fixed layer 312 of the lower layer and they are made of CoMnGe, a Heusler alloy, and $CO_{25}Fe$, respectively. A Ru layer, an antiferromagnetic layer, is provided between the two fixed layers 311, 312. The fixed layer 213 preferably has a Heusler alloy layer. It accomplishes a high MR ratio. Typically, a Heusler alloy layer in the fixed layer 213 has the same composition as a Heusler alloy layer in the free layer 215. The non-magnetic intermediate layer 214 includes an upper Cu layer and a lower Cu layer and an $Al_{10}Cu$ layer between them. The cap layer 216 includes a Cu layer and a Ru layer.

In the free layer 215, the Heusler alloy layer 511 is a CoMnGe layer. Other Heusler alloys having various structures are known. It is preferable to use a Heusler alloy having the L21 structure, $X_2YZ$, or the B12 structure. Co may be used as X. Mn, Cr or Fe may be used as Y. Ge, Al or Si may be used as Z. Particularly, $CO_2MnGe$ is a preferable Heusler alloy since it is easy to produce. It is noted that the representation of CoMnGe does not limit the relative proportions and the present invention can use Heusler alloys other than CoMnGe.

Figure 7:
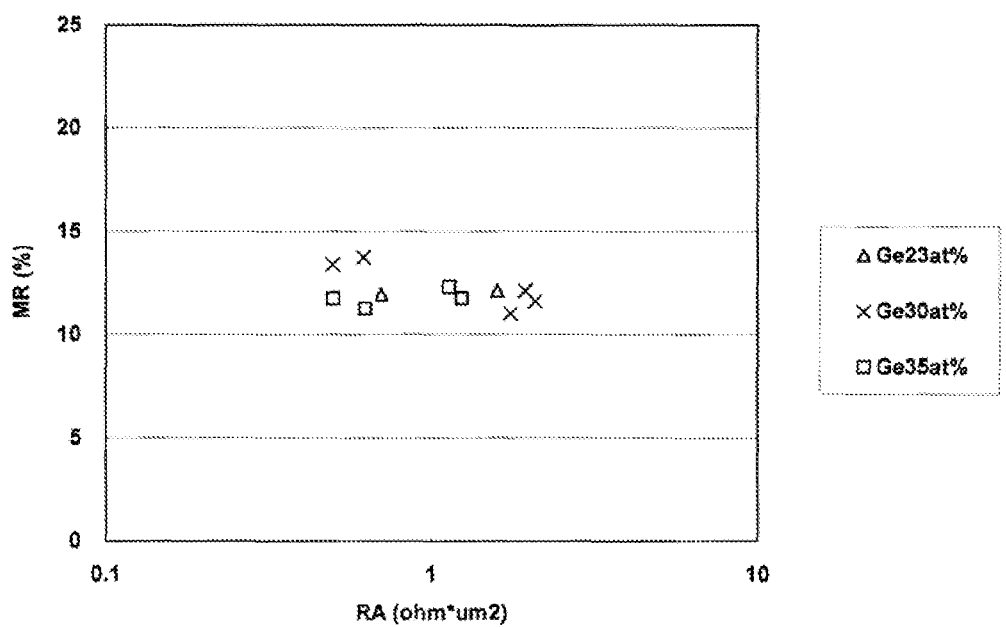
FIG. 7 shows measurement data of MR outputs with different relative proportions of a Heusler alloy layer.

FIG. 7 shows measurement data of the relationship between MR outputs and the relative proportions of a Heusler alloy layer. The relative proportions of a Heusler alloy layer are changed by changing the proportions of Ge and $CO_2Mn$. The proportion of Ge is indicated. Not only typical relative proportions of $CO_2MnGe$ but also a wide range of relative proportion of Ge of 23 to 35 at % can accomplish a superior MR property. Ge 30 at % is preferable in the range since it accomplishes the highest MR output.

The Co-based amorphous metal layer 512 is a layer of Co—X: Ta, Ti, Zr, Nb, Hf, W and B or Co—Fe—X: Ta, Ti, Zr, Nb, Hf, W and B. Co—X and Co—Fe—X include one or more elements of the above mentioned elements. The relative proportions of Co, Fe, and X are not limited. Preferably, the proportion of X is 12 at % to 25 at %. If the proportion of X is less 12 at %, the Co-based amorphous metal layer crystallizes, so it is not preferable. If the proportion of X is more 25 at %, the Co-based amorphous metal layer becomes non-magnetic, so it is not preferable. The representation of Co—X and Co—Fe—X does not restrict the relative proportions of the constituents. These materials are preferable for the Co-based amorphous metal layer 512 in order to accomplish a high MR ratio and low magnetostriction.

An examples of the thicknesses of layers in the laminated structure illustrated in FIG. 4 is from the bottom, the $Mn_{22}Ir$ layer of 60 Å, the $CO_{25}Fe$ layer of 20 Å, the Ru layer of 4.5 Å, the CoMnGe layer of 25 Å, the Cu layer of 5 Å, the $Al_{10}Cu$ layer of 15 Å, the Cu layer of 5 Å, the CoMnGe layer of 35 Å, the Co—X/Co—Fe—X layer of 35 Å, the Cu layer of 20 Å and the Ru layer of 10 Å.

With continued reference to the structure in FIG. 4, if the Co-based amorphous metal layer 512 has a thickness similar to the Heusler alloy layer 511, Co—X is preferable to Co—Fe—X. This is because Co—X has a lower magnetostriction constant than Co—Fe—X. Co—X allows the magnetoresistive sensor 112 to exhibit the superior low magnetostriction property even if the Co-based amorphous metal layer 512 is thick.

Figure 5:
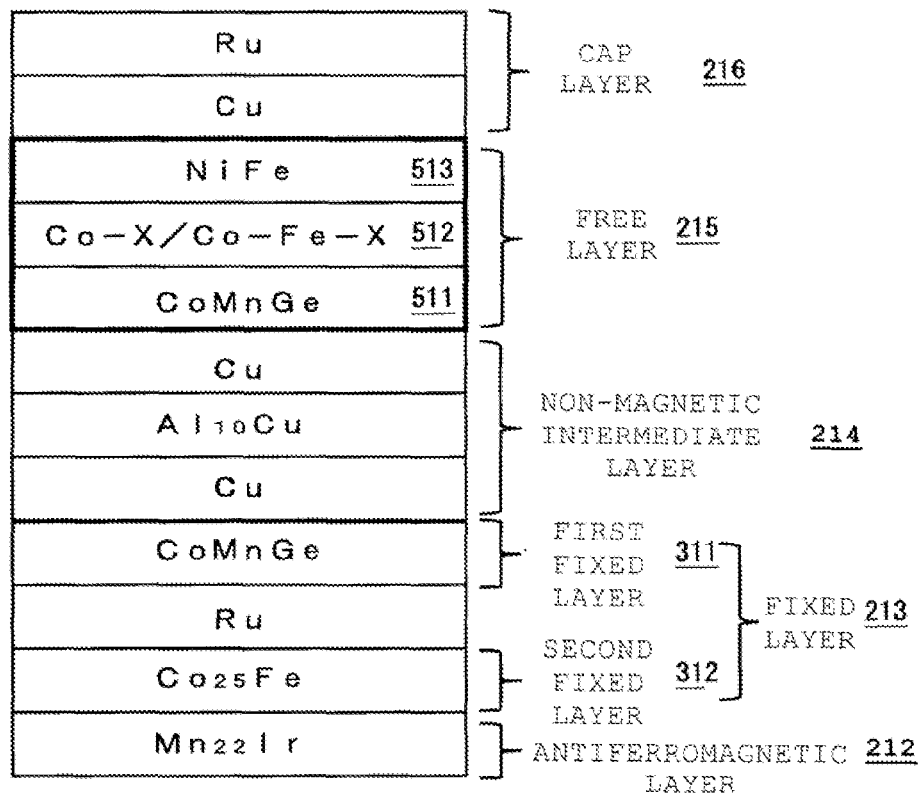
FIG. 5 schematically illustrates a preferred example of a magnetoresistive sensor with the laminated structure depicted in FIG. 3(b).

FIG. 5 depicts a preferred example of the magnetoresistive sensor 112 with the laminated structure shown in FIG. 3(b). It has the same structure as the laminated structure depicted in FIG. 4 except for the structure of the free layer 215. In the magnetoresistive sensor 112 in FIG. 5, the metal crystal soft magnetic layer 513 is formed of a NiFe alloy. For the metal crystal soft magnetic layer 513, a soft magnetic metal including any element or any combination of elements selected from Co, Fe and Ni may be used. The materials of the Co-based amorphous metal layer 512 and the Heusler alloy layer 511 are the same as the structure in FIG. 4.

In the free layer 215, for example, the CoMnGe layer has a thickness of 35 Å, the Co—Fe—X/Co—X layer has a thickness of 5 Å and the NiFe layer has a thickness of 35 Å. Even if the Co-based amorphous metal layer 512 works as an intermediate layer, the Co—Fe—X/Co—X layer accomplishes a high MR ratio and low magnetostriction.

If the proportions of X in Co—Fe—X and Co—X are the same, Co—Fe—X has a higher Curie temperature and a higher magnetic moment per volume (magnetization). Co—X is superior to Co—Fe—X in the magnetostriction property. Thus, in designing the magnetoresistive sensor 112, a preferred material in the magnetostriction property and magnetization and Curie temperature properties is used for the Co-based amorphous metal layer 512.

Figure 6:
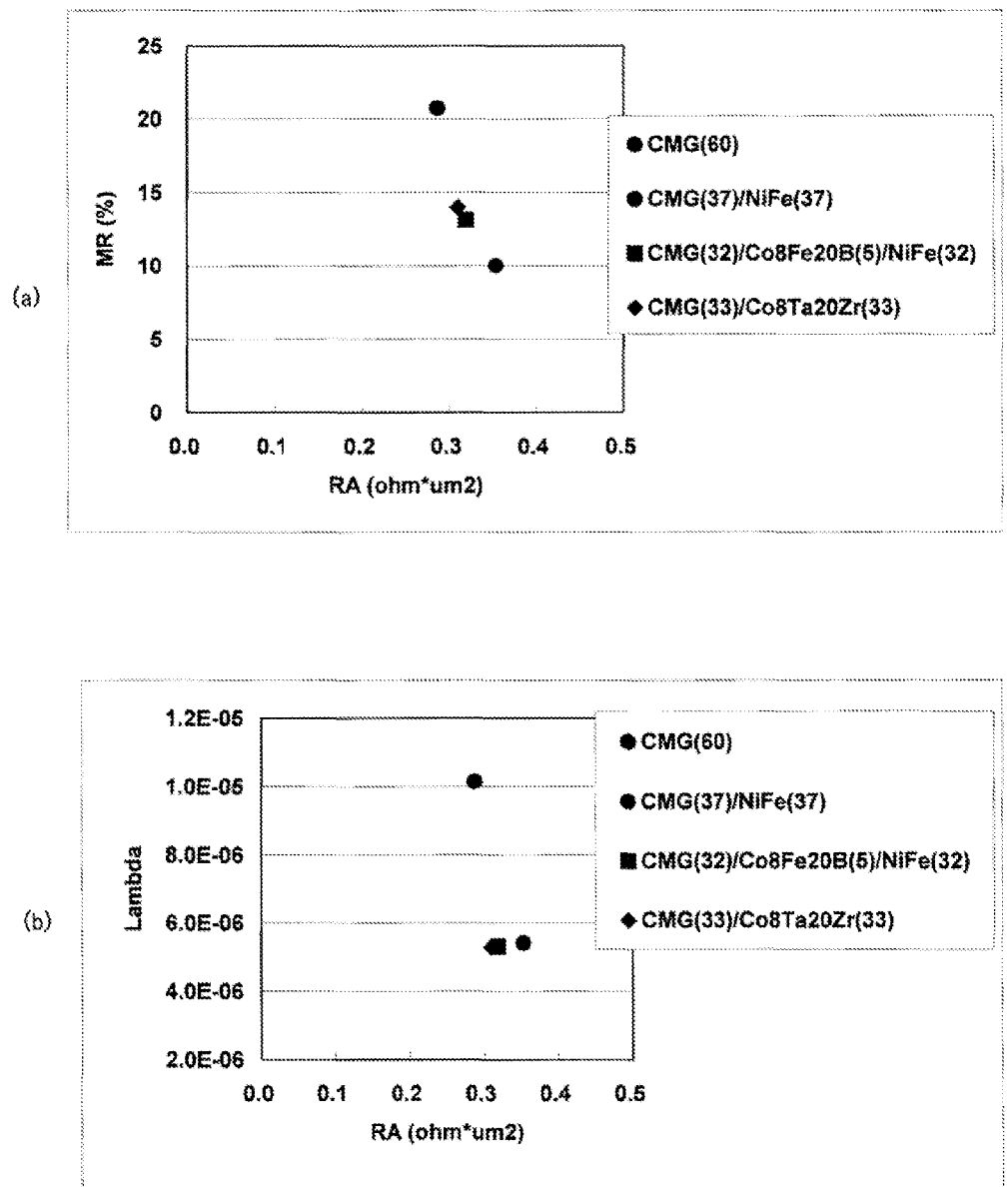
FIGS. 6(a) and 6(b) show measurement data comparing a magnetoresistive sensor according to the present embodiment and a magnetoresistive sensor with conventional structure.

Hereafter, measurement data on a magnetoresistive sensor with a free layer structure according to the present embodiment will be shown compared to a magnetoresistive sensor with a conventional structure. FIG. 6(a) shows measurement data of MR outputs and FIG. 6(b) shows measurement data of magnetostriction. The measurement was carried out on magnetoresistive sensors with different free layer structures and the same layer structure except for the free layer. Specifically, the MR outputs and the magnetostriction are measured on magnetoresistive sensors with a free layer having a CoMnGe layer of 60 Å, a free layer having a CoMnGe layer of 37 Å and a NiFe layer of 37 Å, a free layer having a CoMnGe layer of 32 Å, a $CO_8Fe_{20}B$ layer of 5 Å and NiFe of 32 Å, and a free layer having a CoMnGe layer of 33 Å and a $CO_sTa_{20}Zr$ layer of 33 Å.

As shown in the graph of FIG. 6(a), compared to the laminated structure having the CoMnGe layer of 37 Å and the NiFe layer of 37 Å, the other laminated structures exhibit high MR ratios. In the data showing the magnetostriction in FIG. 6(b), compared to the free layer having a single CoMnGe layer, the other laminated structures exhibit low magnetostriction. Namely, the free layer having the single Heusler alloy layer exhibits a high MR ratio but the magnetostriction is also large. A free layer having a Heusler alloy layer and a metal crystal soft magnetic layer exhibits low magnetostriction but the low MR ratio is also small.

In contrast, it was verified that a free layer including a Heusler alloy layer and a Co-based amorphous metal layer had a higher MR ratio than a free layer of a Heusler alloy layer and a metal crystal soft magnetic layer and lower magnetostriction than a free layer of a single Heusler alloy layer. Coexistence of a Heusler alloy layer and a Co-based amorphous metal layer accomplished a magnetoresistive sensor with a high MR ratio and low magnetostriction.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic read head including a magnetoresistive sensor where sense current flows in a stacking direction of the magnetoresistive sensor, the magnetoresistive sensor comprising:
   a free layer having a magnetization direction that is affected by external magnetic fields and including a Heusler alloy layer and a Co-based amorphous metal layer;
   a fixed layer which is stacked with the free layer and has a fixed magnetization direction; and
   a non-magnetic intermediate layer between the free layer and the fixed layer,
   wherein the free layer further includes a metal crystal soft magnetic layer, and the Co-based amorphous metal layer is provided between the soft magnetic layer and the Heusler alloy layer,
   wherein the order of magnitude of the thickness of the Co-based amorphous metal layer is no less than the order of magnitude of thickness of the Heusler alloy layer.

2. The magnetic read head according to claim 1, wherein the Co-based amorphous metal layer includes at least one element selected from a group consisting of Ta, Ti, Zr, Nb, Hf, W and B.

3. The magnetic read head according to claim 1, wherein the Co-based amorphous metal layer is made of Co—Fe—X, where X is one or more elements selected from a group consisting of Ta, Ti, Zr, Nb, Hf, W and B.

4. The magnetic read head according to claim 1, wherein the Co-based amorphous metal layer is made of Co—X, where X is one or more elements selected from a group consisting of Ta, Ti, Zr, Nb, Hf, W and B.

5. The magnetic read head according to claim 1, wherein the fixed layer includes a Heusler alloy layer.

6. A system, comprising:
   a magnetic recording medium;
   at least one magnetic head as recited in claim 1;
   a drive mechanism for passing the magnetic recording medium over the magnetic head; and
   a controller coupled to the magnetic head for controlling operation of the magnetic head.

7. A magnetic read head including a magnetoresistive sensor where sense current flows in a stacking direction of the magnetoresistive sensor, the magnetoresistive sensor comprising:
   a free layer having a magnetization direction that is affected by external magnetic fields and including a Heusler alloy layer and a Co-based amorphous metal layer;
   a fixed layer which is stacked with the free layer and has a fixed magnetization direction: and
   a non-magnetic intermediate layer between the free layer and the fixed layer,
   wherein the free layer further includes a metal crystal soft magnetic layer, and the Co-based amorphous metal layer is provided between the soft magnetic layer and the Heusler alloy layer,
   wherein the Co-based amorphous metal layer is made of Co—Fe—X, where X is one or more elements selected from a group consisting of Ta, Ti, Zr, Nb, W and B,
   wherein the Co-based amorphous metal layer is one or more orders of magnitude thinner than the Heusler alloy layer.

8. A magnetic read head including a magnetoresistive sensor where sense current flows in a stacking direction of the magnetoresistive sensor, the magnetoresistive sensor comprising:
   a free layer having a magnetization direction that is affected by external magnetic fields and including a Heusler alloy layer and a Co-based amorphous metal layer;
   a fixed layer which is stacked with the free layer and has a fixed magnetization direction; and
   a non-magnetic intermediate layer between the free layer and the fixed layer,
   wherein the free layer further includes a nanomagnetic layer having a BCC structure, and wherein the non-magnetic intermediate layer, the nanomagnetic layer and the Heusler alloy layer are formed successively in this order, and the nanomagnetic layer is one or more orders of magnitude thinner than the Heusler alloy layer.

9. The magnetic read head according to claim 8, wherein the nanomagnetic layer is made of a Co—Fe alloy and the Fe proportion is 30 at % or more.

10. A magnetic read head including a magnetoresistive sensor where sense current flows in a stacking direction of the magnetoresistive sensor, the magnetoresistive sensor comprising:
   a free layer having a magnetization direction that is affected by external magnetic fields and including a Heusler alloy layer and a Co-based amorphous metal layer, wherein the Co-based amorphous metal layer is made of Co—Fe—X, where X is one or more elements selected from a group consisting of Ta, Ti, Zr, Nb, Hf, W and B, wherein the Co-based amorphous metal layer is one or more orders of magnitude thinner than the Heusler alloy layer;

a fixed layer which is stacked with the free layer and has a fixed magnetization direction; and a non-magnetic intermediate layer between the free layer and the fixed layer, wherein the free layer further includes a metal crystal soft magnetic layer, and the Co-based amorphous metal layer is provided between the soft magnetic layer and the Heusler alloy layer.

11. The magnetic read head according to claim 10, wherein the Co-based amorphous metal layer is made of Co—X, where X is one or more elements selected from a group consisting of Ta, Ti, Zr, Nb, Hf, W and B.

12. The magnetic read head according to claim 10, wherein the fixed layer includes a Heusler alloy layer.

13. A system, comprising:
a magnetic recording medium;
at least one magnetic head as recited in claim 10;
a drive mechanism for passing the magnetic recording medium over the magnetic head; and
a controller coupled to the magnetic head for controlling operation of the magnetic head.

14. A magnetic read head including a magnetoresistive sensor where sense current flows in a stacking direction of the magnetoresistive sensor, the magnetoresistive sensor comprising:
a free layer having a magnetization direction that is affected by external magnetic fields and including a Heusler alloy layer and a Co-based amorphous metal layer, wherein the Co-based amorphous metal layer includes at least one element selected from a group consisting of Ta, Ti, Zr, Nb, Hf, W and B;
a fixed layer which is stacked with the free layer and has a fixed magnetization direction; and
a non-magnetic intermediate layer between the free layer and the fixed layer,
wherein the free layer further includes a metal crystal soft magnetic layer, and the Co-based amorphous metal layer is provided between the soft magnetic layer and the Heusler alloy layer,
wherein the order of magnitude of the thickness of the Co-based amorphous metal layer is no less than the order of magnitude of thickness of the Heusler alloy layer.

15. A magnetic read head including a magnetoresistive sensor where sense current flows in a stacking direction of the magnetoresistive sensor, the magnetoresistive sensor comprising:
a free layer having a magnetization direction that is affected by external magnetic fields and including a Heusler alloy layer and a Co-based amorphous metal layer, wherein the Co-based amorphous metal layer includes at least one element selected from a group consisting of Ta, Ti, Zr, Nb, Hf, W and B;
a fixed layer which is stacked with the free layer and has a fixed magnetization direction; and
a non-magnetic intermediate layer between the free layer and the fixed layer,
wherein the free layer further includes a nanomagnetic layer having a BCC structure, and wherein the non-magnetic intermediate layer, the nanomagnetic layer and the Heusler alloy layer are formed successively in this order, and the nanomagnetic layer is one or more orders of magnitude thinner than the Heusler alloy layer.

16. The magnetic read head according to claim 15, wherein the nanomagnetic layer is made of a Co—Fe alloy and the Fe proportion is 30 at % or more.

* * * * *